(12) United States Patent
Mentovich et al.

(10) Patent No.: US 10,996,401 B2
(45) Date of Patent: May 4, 2021

(54) METHOD AND APPARATUS FOR OPTICAL COUPLING OF OPTICAL SIGNALS FOR A PHOTONIC INTEGRATED CIRCUIT

(71) Applicant: Mellanox Technologies, Ltd., Yokneam (IL)

(72) Inventors: Elad Mentovich, Tel Aviv (IL); Itshak Kalifa, Ramat Gan (IL); Sylvie Rockman, Zichron Yaakov (IL); Anna Sandomirsky, Nesher (IL); Giannis Poulopoulos, Korydallos (GR); Dimitrios Kalavrouziotis, Acharnes (GR); Paraskevas Bakopoulos, Ilion (GR); Hercules Avramopoulos, Kifisia (GR); Xin Yin, Ghent (BE); Geert Van Steenberge, Sint Amandsberg (BE)

(73) Assignee: Mellanox Technologies, Ltd., Yokneam (IL)

( * ) Notice: Subject to any disclaimer, the term of this patent is extended or adjusted under 35 U.S.C. 154(b) by 70 days.

(21) Appl. No.: 16/313,503

(22) PCT Filed: Jun. 30, 2016

(86) PCT No.: PCT/GR2016/000029
§ 371 (c)(1),
(2) Date: Dec. 27, 2018

(87) PCT Pub. No.: WO2018/002675
PCT Pub. Date: Jan. 4, 2018

(65) Prior Publication Data
US 2020/0183085 A1    Jun. 11, 2020

(51) Int. Cl.
*G02B 6/12* (2006.01)
*G02B 6/30* (2006.01)
(Continued)

(52) U.S. Cl.
CPC ............. *G02B 6/30* (2013.01); *G02B 6/1223* (2013.01); *G02B 6/4214* (2013.01);
(Continued)

(58) Field of Classification Search
None
See application file for complete search history.

(56) References Cited

U.S. PATENT DOCUMENTS

| | | |
|---|---|---|
| 2002/0037138 A1 | 3/2002 | Kaneko et al. |
| 2004/0101246 A1* | 5/2004 | Kapusta ................... G02B 6/42 385/43 |

(Continued)

OTHER PUBLICATIONS

Brusberg, L. et al., "Photonic System-in-Package technologies using thin glass substrates", Electronics Packaging Technology Conference, 2009, EPTC 09, 11th, IEEE, dated Dec. 9, 2009, pp. 930-935.

(Continued)

*Primary Examiner* — Michael Stahl
(74) *Attorney, Agent, or Firm* — Alston & Bird LLP

(57) ABSTRACT

An optical coupler and method of assembly are described that provide efficient coupling from the photonic integrated circuit (PIC) waveguide layer to external components, such as optical fibers, VCSELs, photodetectors, and gain blocks, among others. The optical coupler includes a PIC that can be supported by a printed circuit board, an optoelectronic transducer supported by the PIC that can convert between optical signals and corresponding electrical signals, and a coupled waveguide assembly. The coupled waveguide assembly includes a low-index waveguide, a high-index waveguide, and a reflective surface that changes a pathway of the optical signals to direct the optical signals from the optoelectronic transducer into the low-index waveguide or from the low-index waveguide into the optoelectronic transducer.

20 Claims, 4 Drawing Sheets

(51) Int. Cl.
  *G02B 6/122* (2006.01)
  *G02B 6/42* (2006.01)
  *H01S 5/183* (2006.01)

(52) U.S. Cl.
  CPC .......... *G02B 6/1225* (2013.01); *G02B 6/1228* (2013.01); *G02B 6/305* (2013.01); *G02B 2006/1213* (2013.01); *G02B 2006/12061* (2013.01); *H01S 5/183* (2013.01)

(56) References Cited

U.S. PATENT DOCUMENTS

| | | | |
|---|---|---|---|
| 2004/0156576 A1* | 8/2004 | Windover | H05K 1/0274 385/14 |
| 2010/0098379 A1* | 4/2010 | Kopp | B82Y 20/00 385/37 |
| 2010/0304514 A1* | 12/2010 | Block | G02B 6/42 438/27 |
| 2012/0189253 A1* | 7/2012 | Shacklette | G02B 6/42 385/88 |
| 2013/0330049 A1* | 12/2013 | Yanagisawa | G02B 6/4214 385/88 |
| 2014/0177995 A1 | 6/2014 | Mohammed et al. | |
| 2014/0203175 A1 | 7/2014 | Kobrinsky et al. | |
| 2015/0381273 A1 | 12/2015 | Gloeckner et al. | |
| 2016/0018610 A1 | 1/2016 | Krishnamurthi et al. | |
| 2016/0070063 A1* | 3/2016 | Huang | G02B 6/126 385/11 |
| 2016/0139334 A1* | 5/2016 | Sakakibara | G02B 6/12002 385/43 |

OTHER PUBLICATIONS

Mohammed, E. et al., "Efficient and scalable single mode waveguide coupling on silicon based substrates", Optomechatronic Micro/Nano Devices and Components III, [Proceedings of SPIE], ISSN, vol. 8991, dated Mar. 8, 2014.

International Search Report and Written Opinion for International Application No. PCT/GR2016/000029 dated Mar. 22, 2017, 12 pages.

* cited by examiner

METHOD AND APPARATUS FOR OPTICAL COUPLING OF OPTICAL SIGNALS FOR A PHOTONIC INTEGRATED CIRCUIT

CROSS-REFERENCE TO RELATED APPLICATIONS

This application is a national phase entry of International Application No. PCT/GR2016/000029, filed Jun. 30, 2016, the entire contents of which are incorporated herein by reference.

BACKGROUND

The present disclosure relates in general to electro-optical interfaces for transmitting and receiving optical signals through fiber optic cable systems. In particular, apparatuses and methods of transmitting optical signals between opto-electronic transducers, including-vertical-cavity surface-emitting lasers (VCSELs) and photodiodes, and optical fibers as a part of a Photonic Integrated Circuit (PIC) are described.

As technology progresses and the demand for high bandwidth transmission of optical signals over fiber optic networks in data centers increases, the tolerances associated with the placement of components in the optical interconnects, such as for transmitting optical signals from a VCSEL to an optical fiber and/or from an optical fiber to a photodiode, become tighter. Such tight fabrication tolerances and strict requirements regarding the types of materials that can be used result in added cost and complexity in making the optical interconnects.

BRIEF SUMMARY

Embodiments of the invention described herein therefore provide improved optoelectronic interfaces and components thereof, as well as improved methods of assembling opto-electronic interfaces, that allow for higher accuracy in the positioning and alignment of optoelectronic components through the use of a photonic integrated circuit in an active part of the printed circuit board assembly that is used for the optoelectronic interface.

Accordingly, in some embodiments, an optical coupler is provided that includes a photonic integrated circuit (PIC) comprising a substrate, wherein the PIC is configured to be supported by a printed circuit board; an optoelectronic transducer supported by the PIC and configured to convert between optical signals and corresponding electrical signals; and a coupled waveguide assembly supported by the PIC and configured to direct the optical signals between the optoelectronic transducer and an optical fiber. At least a portion of the optoelectronic transducer is positioned adjacent the coupled waveguide assembly. The coupled waveguide assembly comprises a low-index waveguide, a high-index waveguide proximate the low-index waveguide, and a reflective surface configured to change a pathway of the optical signals to direct the optical signals from the optoelectronic transducer into the low-index waveguide or from the low-index waveguide into the optoelectronic transducer.

In some cases, the high-index waveguide may be formed within and may be integral to the substrate defining the PIC. In other cases, the high-index waveguide may be disposed on a surface of the PIC. The PIC may comprise at least one of a nanophotonic silicon on insulator (SOI) substrate or a silicon interposer.

Additionally or alternatively, at least one of the high-index waveguide or the low-index waveguide may define a tapered section that is configured to change a mode of the optical signal passing therethrough. The high-index waveguide may, in some cases, be at least partially contained within the low-index waveguide to create the coupled waveguide assembly. In other cases, the high-index waveguide may be disposed adjacent to the low-index waveguide.

The PIC may be connected to a printed circuit board using at least one of a through-silicon via (TSV) or a redistribution layer (RDL). The optoelectronic transducer may comprise at least one of a vertical-cavity surface-emitting laser (VCSEL) or a photodiode.

In some embodiments, the reflective surface may comprise a first reflective surface configured to change a pathway of the optical signals to direct the optical signals from the optoelectronic transducer into the low-index waveguide or from the low-index waveguide into the optoelectronic transducer, and the coupled waveguide assembly may further comprise a second reflective surface configured to change a pathway of the optical signals to direct the optical signals from the optical fiber into the coupled waveguide system or from the coupled waveguide system into the optical fiber. In other embodiments, the reflective surface may comprise a prism separate from and disposed proximate the low-index waveguide. The reflective surface may comprise an angled facet of the low-index waveguide.

In some cases, the coupled waveguide system may comprise a plurality of at least one of the low-index waveguide or the high-index waveguide.

In other embodiments, a method of assembling an optical coupler is provided that includes providing a photonic integrated circuit (PIC) comprising a substrate; supporting an optoelectronic transducer on the PIC, wherein the optoelectronic transducer is configured to convert between optical signals and corresponding electrical signals; and forming a coupled waveguide assembly supported by the PIC. The coupled waveguide assembly is configured to direct the optical signals between the optoelectronic transducer and an optical fiber, and at least a portion of the optoelectronic transducer is positioned adjacent the coupled waveguide assembly. Moreover, the coupled waveguide assembly is formed by coupling at least one low-index waveguide with at least one high-index waveguide and providing a reflective surface configured to change a pathway of the optical signals to direct the optical signals from the optoelectronic transducer into the low-index waveguide or from the low-index waveguide into the optoelectronic transducer.

In-some cases, providing the PIC may comprise using at least one of a nanophotonic silicon on insulator (SOI) substrate or a silicon interposer. The PIC may be connected to a printed circuit board using at least one of a through-silicon via (TSV) or a redistribution layer (RDL). Forming the coupled waveguide assembly may comprise forming a tapered section on the high-index waveguide proximate the low-index waveguide, wherein the tapered section is configured to change the mode of the optical signal. Additionally or alternatively, supporting an optoelectronic transducer on the PIC may comprise mounting the optoelectronic transducer on the PIC using flip-chip technology.

In some embodiments, providing the reflective surface may comprise forming a prism separate from and disposed proximate to an end of the low-index waveguide. In other cases, providing the reflective surface may comprise creating an angled facet of the low-index waveguide.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

DETAILED DESCRIPTION OF THE DRAWINGS

Figure 1:
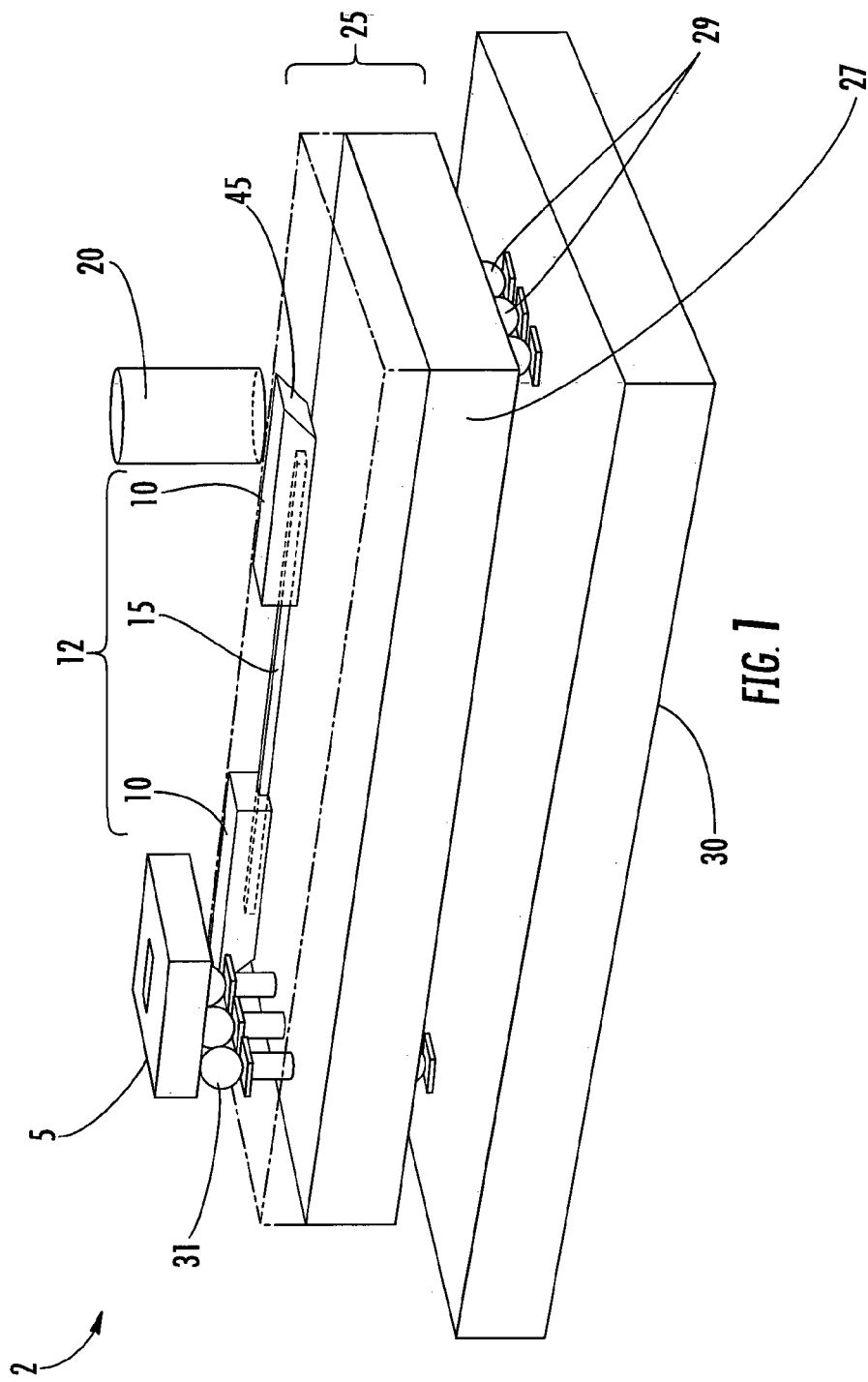
FIG. 1 is a perspective view of the optical coupler attached to a printed circuit board (PCB) according to an example embodiment.

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

New broadband applications are reshaping the Internet into a content-centric network, causing the proliferation of datacenters. The availability of high-speed access technologies such as very-high-bit-rate digital subscriber line (VDSL) and fiber-to-the-home (FTTH) has led to the growth of many new web applications, from traditional searching in online interactive maps to video streaming, social networking and cloud computing, with the vast majority of applications running in datacenters and offered free-of-charge. This has stimulated the growing trend of warehouse-scale mega-datacenter computing, where thousands of servers are incorporated in a server farm, causing the pressing need to transfer massive amounts of data between racks, boards and modules quickly, efficiently, and at relatively low cost.

At the same time, datacenter traffic is experiencing a relentless growth exceeding 25% CAGR (compound annual growth rate), and annual Internet Protocol (IP) traffic is expected to exceed 7.7 ZB. The largest portion of this traffic (approximately 76%) resides within the datacenter, while the emerging disaggregated-datacenter model is expected to further increase this trend, posing inordinate challenges to the datacenter network.

To cope with these requirements, optical technology has been put in the spotlight due to the unparalleled capacity of optical media. An accelerated penetration of optics into short-distance, inter- and intra-rack transmission links from a few centimeters to hundreds of meters long has marked the new paradigm of optical interconnects. Driven by market needs and the ever-rising appetite for bandwidth, what started as a niche application is turning into a huge market, with board-level interconnects alone expected to generate as much as $3.5 billion in 2015.

So far, optical interconnects have relied primarily on low-cost commodity optical components assembled in a package. Although this concept proved substantially successful in the first generations of optical interconnect modules, scalability is a daunting issue to meet the requirements of future datacenters. With the per-chip performance of electronics continuing to improve, optical interconnection needs to keep pace and offer the capability to handle the increasing amounts of traffic. This is vividly reflected in the latest standardization activities in the field, which are raising the bar for signal rates of 100 Gb/s, with an intermediate target of 50 Gb/s. As component manufacturers grapple to develop products meeting these performance targets with reasonable cost, new technological paradigms are needed to accommodate this bandwidth explosion.

Modern datacenters carry hundreds of gigabits through hundreds of meters of cable using different types of optical interconnect components, such as active optical cables (AOCs) as well as mid-board optical modules (MBOMs). These components are enabled by so-called optical engines, which are miniaturized, self-contained, electrical-to-optical transceiver units that fit in AOC enclosures or mount on printed circuit boards (PCBs) or inside integrated circuit (IC) packages. Optical engines typically rely either on vertical-cavity surface-emitting lasers (VCSELs) or silicon photonics. Either approach exhibits advantages and disadvantages. VCSELs are low cost but need external components to provide advanced functionalities, such as wavelength division multiplexing (WDM), that are frequently sought in optical interconnects. On the other hand, silicon photonics supports a broad range of functionalities including WDM filtering, switching etc., but lacks a low cost and reliable method for on-chip light generation. For this reason, the use of an external laser source is preferred as a realistic, close-to-market solution; however, coupling of the light from the external laser to the silicon photonic waveguide, as well as from the silicon photonic waveguide to the optical fiber or from the silicon photonic waveguide to an external photodetector is a nontrivial task, as it requires extensive mode conversion to match the different mode sizes of the respective components and avoid excessive losses at the interfaces.

The mainstream approach for silicon photonics is the use of a grating coupler that generally couples light to an angle close to the vertical. Grating couplers, however, typically exhibit high losses and polarization sensitivity. The former can be mitigated with complex designs associated with very tight fabrication tolerances and strict requirements on the materials involved, whereas the latter can be mitigated with polarization diversity, which generally (unfortunately) doubles the required chip area. Both solutions result in higher fabrication cost and are therefore not suitable for cost-sensitive applications.

Another approach that has been proposed involves in-plane coupling from a high-index silicon waveguide to a low-index waveguide that is in close proximity to, or surrounds, the silicon waveguide. An inverse taper is typically used at the silicon waveguide to stimulate the conditions for coupling the light out of the high-index silicon waveguide to the low index waveguide, which is typically made of polymer or glass. The mode in the low index waveguide has a high overlap with the mode of the laser or optical fiber that needs to be addressed. Therefore the respective component can be in-plane coupled (e.g., butt-coupled) with low losses. In-plane coupling of VCSELs, optical fibers, or surface-illuminated photodetectors, however, gives rise to a number of concerns regarding the assembly of these components with low cost. For VCSELs and photodiodes, flip-chip assembly is preferred as it provides direct access between the electrical bond pads of the VCSEL and those of the silicon chip. This necessitates perfect vertical coupling, which is not directly feasible with the methods described above. Vertical coupling is also beneficial for optical fibers, because in-plane coupling requires that the coupler is placed only at the edge of the chip and requires custom design of the PCB hosting the chip to accommodate the protruding optical fiber.

Embodiments of the invention described herein provide a low-loss, "perfect" vertical coupling between the photonic integrated chip and flip-chipped optoelectronic components or optical fibers that is compatible with low-cost assembly methods. In particular, assemblies and methods for providing out-of-plane coupling between a photonic integrated circuit (PIC) and an optical fiber or an optoelectronic element (such as a VCSEL, a surface-illuminated photodetector, or a gain block, such as a vertical cavity semiconductor optical amplifier, configured to enable a hybrid silicon laser design) are described herein, in which the coupling mechanism relies on in-plane mode-conversion from a high-index contrast waveguide layer of the PIC to a low index contrast waveguide and the use of reflectors implemented on the low index contrast waveguide for directing the light vertically (e.g., at a 90° angle with respect to its pathway through the low index contrast waveguide) towards an optical fiber or an optoelectronic component. According to the embodiments described herein, the angle of light reflection can be adjusted by tailoring the angle of the mirror, whereas the beam size and divergence can be controlled by modifying the design of the low index contrast waveguide, as described in greater detail herein.

With reference now to FIG. 1, an optical coupler 2 according to embodiments of the present invention is shown. The optical coupler 2 may comprise a PIC 25 comprising a substrate 27 configured for supporting various optical and/or electronic components. A PIC is a device that integrates multiple (at least two) photonic functions. The techniques for making PICs are similar to those used to make electronic integrated circuits, in which photolithography is used to pattern wafers for etching and material deposition. According to some embodiments, various types of devices may be formed on the PIC 25, including low loss interconnect waveguides, power splitters, optical amplifiers, optical modulators, filters, lasers and detectors, as described in greater detail below.

In this regard, the substrate 27 of the PIC 25 may be made of silicon, silica, or other materials. In silicon photonics, for example, photonic functions are implemented on silicon chips. As another example, silica-on-silicon integrated optics uses silicon wafers, with silica waveguides being used to provide coupling, filtering, and other photonics functions. In some embodiments, for example, the PIC 25 may comprise a nanophotonic silicon on insulator (SOI) substrate. The nanophotonic SOI substrate may be formed using pure crystal silicon and silicon oxide.

Regardless of the substrate material, the PIC 25 may be configured to be supported by a printed circuit board (PCB 30), as shown in FIG. 1. The PIC 25 may, for example, be supported on a surface of the PCB 30 via electrically conductive beads 29 that secure the PIC to the PCB and allow electrical signals to pass between the PCB and the optoelectronic components supported by the PIC substrate 27. In other embodiments, the PIC 25 may comprise a silicon interposer, and the silicon interposer may be connected to the PCB 30 using at least one of a through-silicon via (TSV) (such as the TSV 50 shown in FIG. 2) or a redistribution layer (RDL). The TSV 50 may, for example, serve as a conduit into the optical transducer 5. In still other embodiments, the PIC 25 may be supported on another electronic, optoelectronic or photonic chip (e.g., chip stacking). In such cases, the PIC may be attached onto the supporting chip in a face-up configuration or in a flip-chip configuration. Example structures for supporting a PIC are described in co-pending U.S. application Ser. No. 15/187,109 entitled "Printed Circuit Board Assembly with a Photonic Integrated Circuit for an Electro-Optical Interface," the contents of which are incorporated by reference herein.

The optical coupler 2 may further comprise an optoelectronic transducer 5 that is supported by the PIC 25 and is configured to convert between optical signals and corresponding electrical signals. In some cases, the optoelectronic transducer 5 may be attached to the PCB 25 using flip-chip technology. For example, the optoelectronic transducer 5 may be supported by the PIC 25 via one or more electrically conductive beads 31. In some embodiments, the optoelectronic transducer 5 may comprise an array of vertical-cavity surface-emitting lasers (VCSELs) configured to convert electrical signals to optical signals (e.g., for transmission to an optical fiber 20), or an array of photodiodes configured to convert optical signals (e.g., received from an optical fiber 20) to electrical signals. In yet another embodiment, the optoelectronic transducer 5 comprises one or more VCSELs and one or more photodiodes.

According to embodiments of the present invention, the optical coupler 2 may further comprise a coupled waveguide assembly 12 that is supported by the PIC 25 and is configured to direct the optical signals between the optoelectronic transducer 5 and the optical fiber 20. In some embodiments the optical fiber 20 may comprise a multicore fiber (MCF), whereas in other embodiments the optical fiber 20 may comprise a multimode fiber (MFF) array. For example, with reference to FIGS. 1 and 2, at least a portion of the optoelectronic transducer 5 may be positioned adjacent the coupled waveguide assembly 12, such that optical signals are directed from the optoelectronic transducer into the coupled waveguide assembly (e.g., in embodiments in which the optoelectronic transducer is a VCSEL) or from the coupled waveguide assembly into the optoelectronic transducer (e.g., in embodiments in which the optoelectronic transducer is a photodiode).

Figure 2:
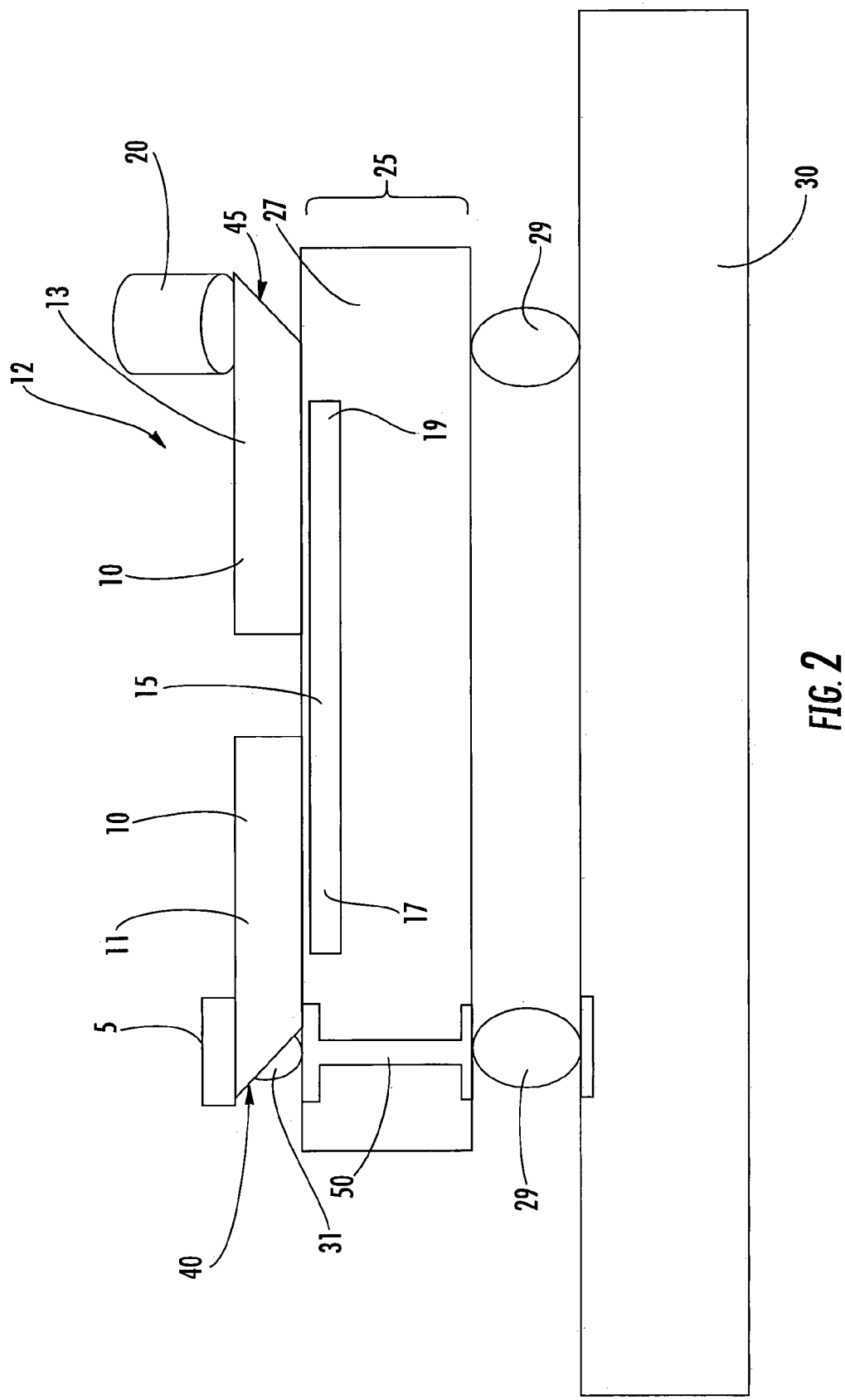
FIG. 2 is a side view of the optical coupler of FIG. 1 according to an example embodiment.

With reference to FIG. 2, for example, the coupled waveguide assembly 12 may comprise one or more low-index waveguides 10 and one or more high-index waveguides 15. In FIG. 2, for example, the coupled waveguide assembly 12 includes two low-index waveguides 10 and one high-index waveguide 15 positioned between the two low-index waveguides. The coupled waveguide 12 further comprises at least one reflective surface 40 that is configured to change a pathway of the optical signals, such as by reflecting the optical signals that are incident to the reflective surface, thereby redirecting them by a certain angle.

In this regard, the reflective surface 40 may be positioned proximate the optoelectronic transducer 5 (e.g., disposed adjacent to the optoelectronic transducer as shown in FIGS. 1 and 2), such that optical signals generated by the optoelectronic transducer are passed through a portion of the low-index waveguide 10 of the coupled waveguide assembly 12 following a first pathway of travel, reflect off the reflective surface 40, then travel through the low-index waveguide assembly 10 following a second pathway of travel, towards the receiving optical fiber 20. The second pathway in this example may thus be at approximately a 90° angle with respect to the first pathway, based on the particular configuration of the reflective surface and the relative orientations and positions of the optoelectronic transducer. In other embodiments, however, the reflective surface 40 may be configured (e.g., sized, positioned, and/or angled) such that the first and second pathways of travel are oriented at angles other than 90° from each other. In embodiments in which the optoelectronic transducer 5 is a photodiode, the reflective surface 40 may be positioned proximate the optoelectronic transducer (e.g., disposed adjacent to the optoelectronic transducer as shown in FIGS. 1 and 2), such that optical signals transmitted through the low-index waveguide (e.g., from the optical fiber 20) following a first pathway of travel reflect off the reflective surface 40, then travel through a portion of the low-index waveguide assembly following a second pathway of travel and into the optoelectronic transducer.

Moreover, the coupled waveguide assembly 12 may further include first and second reflective surfaces, where the reflective surface disposed proximate the optoelectronic transducer described above is a first reflective surface 40 that is configured to change a pathway of the optical signals to direct the optical signals from the optoelectronic transducer into the low-index waveguide or from the low-index waveguide into the optoelectronic transducer, and where the second reflective surface 45 is disposed proximate the optical fiber 20 and is configured to change a pathway of the optical signals to direct the optical signals from the optical fiber into the coupled waveguide system or from the coupled waveguide system into the optical fiber. In this way, and with respect to FIG. 2 as an example, optical signals from the optoelectronic transducer 5 (e.g., a VCSEL) may be directed downward into the low-index waveguide 10, may become incident to the first reflective surface 40 and change directions to travel to the right, through the low-index waveguide 10, through the high-index waveguide 15, through a second portion of the low-index waveguide 10, and then may become incident to the second reflective surface 45, where the optical signals may change directions again to travel upwards and into the optical fiber 20. In cases where the optoelectronic-transducer is a photodiode, optical signals may be received from the optical fiber 20, may travel down into the low-index waveguide, may become incident to the second reflective surface 45 and change directions to travel to the left, through the low-index waveguide 10, through the high-index waveguide 15, through a second portion of the low-index waveguide 10, and then may become incident to the first reflective surface 40, where the optical signals may change directions again to travel upwards and into the optoelectronic transducer.

Figure 3A:
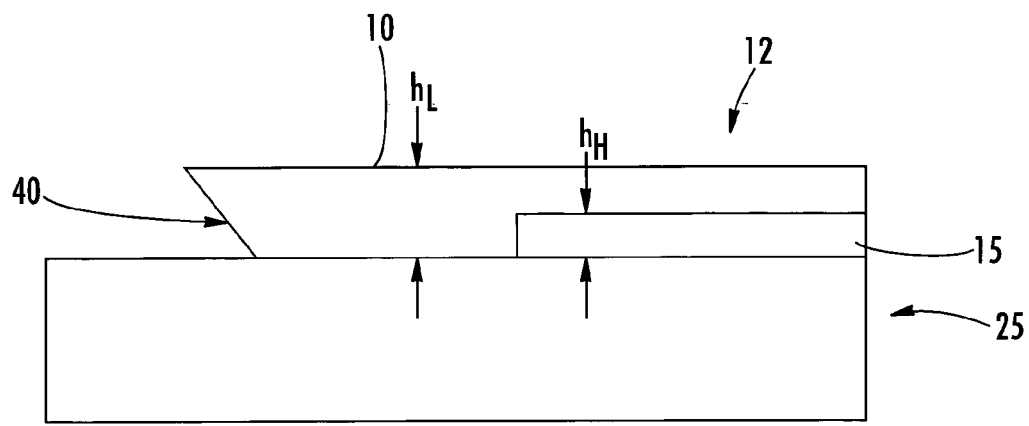
FIGS. 3A-3B are a close-up side view and a close-up top view, respectively, of a portion of the coupled waveguide assembly according to an example embodiment.
Figure 4A:
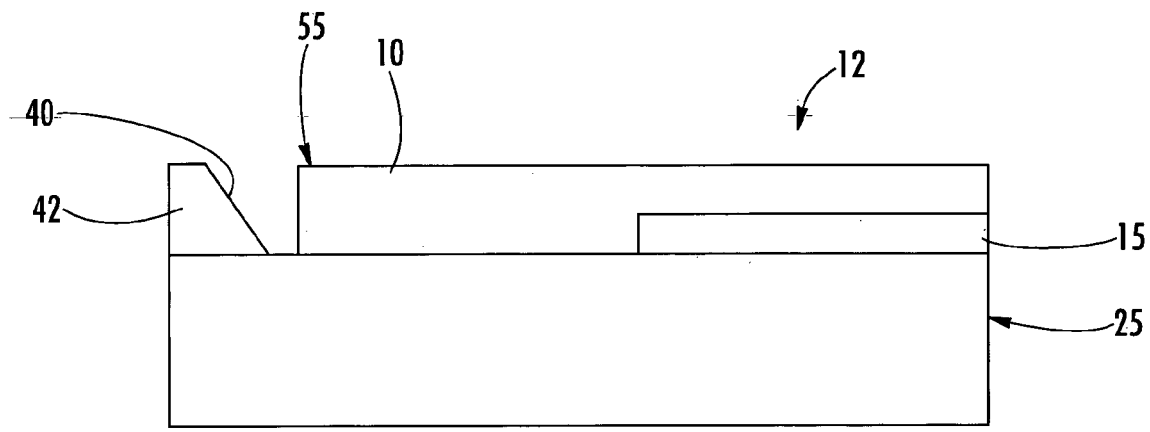
FIGS. 4A-4B are a close-up side view and a close-up top view of a portion of the coupled waveguide assembly according to an example embodiment.
Figure 4B:
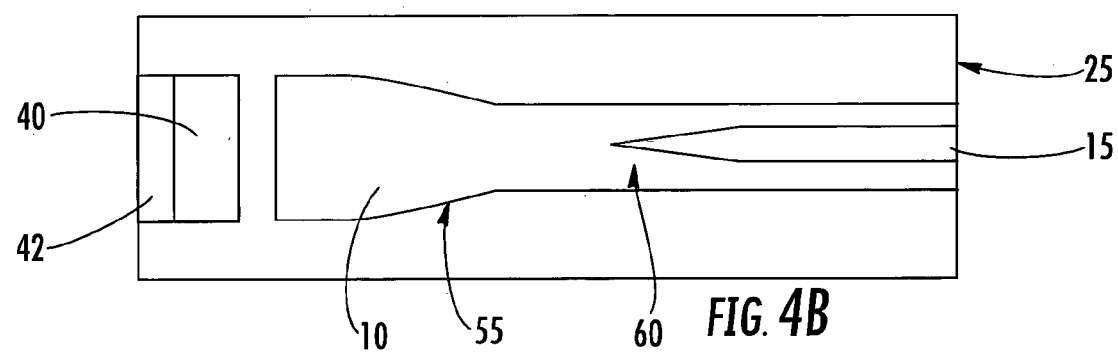

In some embodiments, the reflective surfaces 40, 45 may comprise an angled facet of the low-index waveguide 10 that has a nontransparent material applied thereto, as shown in FIGS. 1 and 2. For example, an end of the low-index waveguide 10 proximate the optoelectronic transducer 5 and/or an end of the low-index waveguide 10 proximate the optical fiber 20 may be cut or etched at a negative angle (e.g., as shown in FIGS. 2 and 3A) to create prisms, and a nontransparent material, such as gold, may be deposited on each angled surface to provide reflective characteristics. In other embodiments, such as shown in FIG. 4A, the reflective surface may comprise a prism 42 that is separate from and disposed proximate the low-index waveguide 10. In this regard, the material forming the separate prism 42, which may be the same or similar material as that forming the low-index waveguide, may be cut or etched at a positive angle, as shown, and a nontransparent material, such as gold, may be deposited on the angled surface to provide reflective characteristics to redirect the light. In either case (separate prism or integral to the end of the low-index waveguide 10), however, instead of depositing a nontransparent material onto the angled surface, reflection of the optical signals may be accomplished based on the total internal reflection due to the refractive index difference between the material of the low-index waveguide or prism and the surrounding air.

With reference now to FIGS. 2-4B, the coupled waveguide assembly 12 may be configured in various different ways. In some embodiments, as depicted in FIG. 2, for example, the high-index waveguide 15 may be formed within and integral to the substrate 27 defining the PIC 25. For example, the material of the high-index waveguide 15 may be applied to the substrate 27 in the process of forming the circuits and other components of the PIC 25 (e.g., during a deposition process). In such embodiments, as shown in FIG. 2, a first low-index waveguide section 11 may be disposed on a surface of the PIC 25 and adjacent to and/or overlaying a first portion 17 of the high-index waveguide 15, while a second low-index waveguide section 13 may be disposed on a surface of the PIC 25 and adjacent to and/or overlaying a second portion 19 of the high-index waveguide 10. The first low-index waveguide section 11 and the first portion 17 of the high-index waveguide 15 may be disposed proximate the optoelectronic transducer 5. Due to the proximity of the low-index waveguide 10 to the high-index waveguide 15 and the configuration of each (e.g., the shape and/or size of each with respect to the other, such as the presence of tapered portions in one or both of the waveguides, as described in greater detail below with respect to FIGS. 3A-4B), the optical signals emitted from the optoelectronic transducer (which may be a VCSEL in this example) pass through the first low-index waveguide section 11 (e.g., in a downward direction in FIG. 2), are redirected by the reflective surface 40, continue through the first low-index waveguide section 11 (e.g., in a direction to the right in FIG. 2), pass into the high-index waveguide 15 via the first portion 17 (e.g., due to tapering of one or both of the waveguides 10, 15), continue into the second portion 19, pass from the high-index waveguide 15 into the second low-index waveguide section 13 (e.g., again due to tapering of one or both of the waveguides 10, 15), continue through the second low-index waveguide section 13, are redirected (e.g., in an upward direction in FIG. 2) by the reflective surface 45, and are received by the optical fiber 20. In a scenario where the optoelectronic transducer 5 is a photodiode, for example, the optical signals would travel in a reverse of the path described above from the optical fiber 20, through the coupled waveguide assembly 12, and into the optoelectronic transducer.

In other embodiments, such as shown in FIGS. 3A and 4A, the high-index waveguide 15 may be disposed on a surface of the PIC 25. For example, the high-index waveguide 15 may be formed as part of the PIC 25 using deposition and/or lithography techniques. The high-index waveguide 15 may, for example, be at least partially contained within the low-index waveguide 10, as shown in FIGS. 3A-4B, to create the coupled waveguide assembly. For example, the high-index waveguide 15 may be disposed in a center area of the low-index waveguide 10, such that a portion of the low-index waveguide 10 extends past an end of the high-index waveguide 15 towards the optoelectronic transducer 5 and a portion of the low-index waveguide 10 extends past an opposite end of the high-index waveguide 15 towards the optical fiber 20 (not shown in FIGS. 3A-4B). In this way, optical signals emitted from the optoelectronic transducer 5 (which may be a VCSEL in this example, but is not shown in FIGS. 3A-4B) pass through an end of the low-index waveguide 10 (e.g., in a downward direction in FIGS. 3A-4B), are redirected by the reflective surface 40, continue through the low-index waveguide (e.g., in a direction to the right in FIGS. 3A-4B), pass into the high-index waveguide 15, pass back into the low-index waveguide at an opposite end of the high-index waveguide (not shown), are redirected (e.g., in an upward direction in the figures) by the reflective surface 45 (not shown), and are received by the optical fiber 20 (not shown). In a scenario where the optoelectronic transducer 5 is a photodiode, the optical signals would travel in a reverse of the path described above from the optical fiber 20, through the coupled waveguide assembly 12, and into the optoelectronic transducer.

Figure 3B:
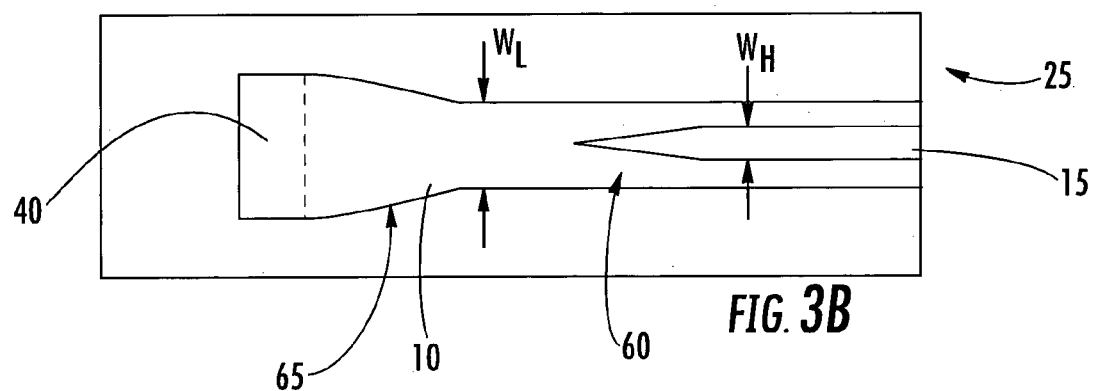

In some cases, at least one of the high-index waveguide 10 or the low-index waveguide 15 defines a tapered section that is configured to change the mode of the optical signal passing therethrough, such that the optical signal is allowed to pass between the high-index waveguide 10 and the low-index waveguide 15. For example, in the embodiment depicted in FIGS. 3A and 3B, and as best seen in FIG. 3B, the high-index waveguide 15 in the depicted embodiment has a taper 60 formed at an end proximate the reflective surface 40 that is disposed near the optoelectronic transducer (not shown). In the depicted example, a width $w_H$ of the high-index waveguide 15 (FIG. 3B) decreases towards the end of the high-index waveguide 15 to form the taper 60, whereas a height $h_H$ of the high-index waveguide 15 (FIG. 3A) remains generally the same. The high-index waveguide 15 of the embodiment depicted in FIGS. 4A-4B includes a similar taper 60.

With reference again to FIGS. 3A and 3B, the low-index waveguide 10 may also be configured such that it (additionally or alternatively) includes a tapered section 65. In this regard, the low-index waveguide 10 may have a width that gradually increases through the tapered section 65 in a direction towards the reflective surface 40, as illustrated in FIG. 3B, while the height $h_L$ of the low-index waveguide 10 (FIG. 3A) remains generally the same. The tapered section 65 of the low-index waveguide 10 may, for example, allow for adjusting the size of the optical mode. The low-index waveguide 10 of the embodiment depicted in FIGS. 4A-4B includes a similar tapered section 65. Moreover, with respect to both the tapered sections 60, 65 of the high-index waveguide 15 and the low-index waveguide 10, the opposite end of the coupled waveguide assembly 12 (not shown in FIGS. 3A-4B) proximate the optical fiber 20 (see FIGS. 1 and 2) may also include one or both tapered sections, such as proximate the other reflective surface 45.

Embodiments of a method of manufacturing an optical coupler as described are also provided. The method includes providing a photonic integrated circuit (PIC) comprising a substrate; supporting an optoelectronic transducer on the PIC, wherein the optoelectronic transducer is configured to convert between optical signals and corresponding electrical signals; and forming a coupled waveguide assembly supported by the PIC. As described above with reference to the figures, the coupled waveguide assembly may be configured to direct the optical signals between the optoelectronic transducer and an optical fiber, and at least a portion of the optoelectronic transducer may be positioned adjacent the coupled waveguide assembly. The coupled waveguide assembly may be formed by coupling at least one low-index waveguide with at least one high-index waveguide and providing a reflective surface that is configured to change a pathway of the optical signals to direct the optical signals from the optoelectronic transducer into the low-index waveguide or from the low-index waveguide into the optoelectronic transducer.

In some cases, providing the PIC comprises using at least one of a nanophotonic silicon on insulator (SOI) substrate or a silicon interposer. The PIC may be connected to a printed circuit board using at least one of a through-silicon via (TSV) or a redistribution layer (RDL), as described above. In some embodiments, forming the coupled waveguide assembly may comprise forming a tapered section on the high-index waveguide proximate the low-index waveguide, wherein the tapered section is configured to change the mode of the optical signal. Moreover, as noted above, the optoelectronic transducer may be mounted on the PIC using flip-chip technology.

In some cases, the reflective surface may be provided by forming a prism separate from and disposed proximate to an end of the low-index waveguide. In other cases, as also described above, the reflective surface may be provided by creating an angled facet of the low-index waveguide.

Accordingly, as described above, embodiments of the present invention generally relate to fiber optic communication components and, more specifically, to PICs and address efficient coupling from the PIC waveguide layer to external components, such as optical fibers, VCSELs, photodetectors, gain blocks, etc. The embodiments described herein are primarily applicable to PIC platforms with high-index contrast such as (but not limited to) silicon photonics, and are tolerant to alignment errors and compatible with low-cost assembly approaches, such as flip-chip technology.

An in-plane mode converter is therefore provided between the high-index waveguide (e.g., the PIC waveguide) and the low-index waveguide (e.g., an additional waveguide with lower index contrast). In some embodiments, the low-index waveguide is placed in close proximity to the high-index waveguide or is formed to surround the high-index waveguide as an over-cladding, as described above. The high-index waveguide can be tapered along the mode-converter to create a coupled waveguide system. In such embodiments, at the output of the taper, the mode is confined in the low-index waveguide. In some cases, an additional taper section on the low-index waveguide may be provided for adjusting the size of the optical mode.

A reflective surface, as described above, may also be provided for changing the direction of the light for out-of-plane coupling. The reflective surface can be formed by creating an angled facet with a negative angle at the tip of the low-index waveguide, or by etching the waveguide to create a prism next to the waveguide's tip, with a positive angle, as described above with reference to the figures. The reflective surface can be formed by depositing a non-transparent material to the angled surface (e.g., gold), or may be based on the total internal reflection due to the refractive index difference between the low-index waveguide and the surrounding air.

Embodiments of the invention may thus be suitable for PIC assemblies targeting applications in various fields, such as telecommunications, optical interconnects, sensors, etc. Embodiments of the invention may further provide additional features and benefits. For example, the optical coupler can be formed on a PIC or on an interposer, with the latter providing additional electrical functionalities and interconnections such as TSVs as noted above. In this regard, an optoelectronic transducer (e.g., a VCSEL) may be flip-chip assembled on top of the out-of-plane optical coupler, and electrical interconnection from the interposer's bond pads to the VCSEL's electrodes may be facilitated with micro-bumps (electrically conductive beads). After coupling the light in the high-index waveguides of the PIC, coupling to an optical fiber may be facilitated using the same method, as described above.

The couplers and methods described above may thus be applied to plurality of waveguides to provide massive input/ output to the PIC. Proper design of the waveguide fan-out and placement of the optical coupling structure on each waveguide may thus facilitate coupling directly to a fiber array or to a multi-core fiber, using an individual coupler properly placed to couple an individual core of the fiber. Moreover, the exact angle of reflection can be adjusted by modifying the design of the reflective surface to provide "perfect" vertical coupling or coupling to any custom angle.

Many modifications and other embodiments of the inventions set forth herein will come to mind to one skilled in the art to which these inventions pertain having the benefit of the teachings presented in the foregoing descriptions and the associated drawings. Although the figures only show certain components of the apparatus and systems described herein, it is understood that various other components (e.g., components that would normally be mounted on the PCB assembly) may also be part of the optoelectronic interface and fiber optic system. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An optical coupler comprising:
a photonic integrated circuit (PIC) comprising a substrate, wherein the PIC is configured to be supported by a printed circuit board;
an optoelectronic transducer supported by the PIC and configured to convert between optical signals and corresponding electrical signals;
a coupled waveguide assembly supported by the PIC and configured to direct the optical signals between the optoelectronic transducer and an optical fiber, wherein at least a portion of the optoelectronic transducer is positioned adjacent the coupled waveguide assembly; and
a reflective surface positioned adjacent the transducer, wherein the coupled waveguide assembly comprises a low-index waveguide, a high-index waveguide at least partially contained within the low-index waveguide, and wherein the reflective surface is configured to change a pathway of the optical signals to direct the optical signals from the optoelectronic transducer into the low-index waveguide or from the low-index waveguide into the optoelectronic transducer.

2. The optical coupler of claim 1, wherein the high-index waveguide is formed within and is integral to the substrate.

3. The optical coupler of claim 1, wherein the high-index waveguide is disposed on a surface of the PIC.

4. The optical coupler of claim 1, wherein the PIC comprises at least one of a nanophotonic silicon on insulator (SOI) substrate or a silicon interposer.

5. The optical coupler of claim 1, wherein at least one of the high-index waveguide or the low-index waveguide defines a tapered section that is configured to change a mode of the optical signal passing therethrough.

6. The optical coupler of claim 1, wherein the PIC is connected to a printed circuit board using at least one of a through-silicon via (TSV) or a redistribution layer (RDL).

7. The optical coupler of claim 1, wherein the optoelectronic transducer comprises at least one of a vertical-cavity surface-emitting laser (VCSEL) or a photodiode.

8. The optical coupler of claim 1, wherein the reflective surface comprises a first reflective surface configured to change a pathway of the optical signals to direct the optical signals from the optoelectronic transducer into the low-index waveguide or from the low-index waveguide into the optoelectronic transducer, and wherein the coupled waveguide assembly further comprises a second reflective surface configured to change a pathway of the optical signals to direct the optical signals from the optical fiber into the coupled waveguide system or from the coupled waveguide system into the optical fiber.

9. The optical coupler of claim 1, wherein the reflective surface comprises a prism separate from and disposed proximate the low-index waveguide.

10. The optical coupler of claim 1, wherein the reflective surface comprises an angled facet of the low-index waveguide.

11. The optical coupler of claim 1, wherein the coupled waveguide system comprises a plurality of at least one of the low-index waveguide or the high-index waveguide.

12. A method of assembling an optical coupler, the method comprising:
providing a photonic integrated circuit (PIC) comprising a substrate;
supporting an optoelectronic transducer on the PIC, wherein the optoelectronic transducer is configured to convert between optical signals and corresponding electrical signals;
forming a coupled waveguide assembly supported by the PIC, wherein the coupled waveguide assembly is configured to direct the optical signals between the optoelectronic transducer and an optical fiber, and wherein at least a portion of the optoelectronic transducer is positioned adjacent the coupled waveguide assembly; and
providing a reflective surface positioned adjacent the transducer,
wherein the coupled waveguide assembly is formed by coupling at least one low-index waveguide with at least one high-index waveguide such that the at least one high-index waveguide is at least partially contained within the at least one low-index waveguide and wherein the reflective surface is configured to change a pathway of the optical signals to direct the optical signals from the optoelectronic transducer into the low-index waveguide or from the low-index waveguide into the optoelectronic transducer.

13. The method of claim 12, wherein providing the PIC comprises using at least one of a nanophotonic silicon on insulator (SOI) substrate or a silicon interposer.

14. The method of claim 12 further comprising connecting the PIC to a printed circuit board using at least one of a through-silicon via (TSV) or a redistribution layer (RDL).

15. The method of claim 12, wherein forming the coupled waveguide assembly comprises forming a tapered section on the high-index waveguide proximate the low-index waveguide, wherein the tapered section is configured to change the mode of the optical signal.

16. The method of claim 12, wherein supporting an optoelectronic transducer on the PIC comprises mounting the optoelectronic transducer on the PIC using flip-chip technology.

17. The method of claim 12, wherein providing the reflective surface comprises forming a prism separate from and disposed proximate to an end of the low-index waveguide.

18. The method of claim 12, wherein providing the reflective surface comprises creating an angled facet of the low-index waveguide.

19. An optical coupler comprising:

a photonic integrated circuit (PIC) comprising a substrate, wherein the PIC is configured to be supported by a printed circuit board and the PIC is connected to the printed circuit board using at least one of a through-silicon via (TSV) or a redistribution layer (RDL);

an optoelectronic transducer supported by the PIC and configured to convert between optical signals and corresponding electrical signals;

a coupled waveguide assembly supported by the PIC and configured to direct the optical signals between the optoelectronic transducer and an optical fiber, wherein at least a portion of the optoelectronic transducer is positioned adjacent the coupled waveguide assembly; and a reflective surface positioned adjacent the transducer, wherein the coupled waveguide assembly comprises a low-index waveguide and a high-index waveguide proximate the low-index waveguide, and wherein the reflective surface is configured to change a pathway of the optical signals to direct the optical signals from the optoelectronic transducer into the low-index waveguide or from the low-index waveguide into the optoelectronic transducer.

20. The optical coupler of claim 19, wherein the high-index waveguide is at least partially contained within the low-index waveguide to create the coupled waveguide assembly.

\* \* \* \* \*